(12) United States Patent
Gorisse et al.

(10) Patent No.: US 10,868,499 B2
(45) Date of Patent: Dec. 15, 2020

(54) ENVELOPE TRACKING VOLTAGE TRACKER CIRCUIT

(71) Applicant: Qorvo US, Inc., Greensboro, NC (US)

(72) Inventors: Philippe Gorisse, Brax (FR); Nadim Khlat, Cugnaux (FR); Jean-Frederic Chiron, Tournefeuille (FR)

(73) Assignee: Qorvo US, Inc., Greensboro, NC (US)

( * ) Notice: Subject to any disclaimer, the term of this patent is extended or adjusted under 35 U.S.C. 154(b) by 82 days.

(21) Appl. No.: 16/199,532

(22) Filed: Nov. 26, 2018

(65) Prior Publication Data
US 2020/0036338 A1    Jan. 30, 2020

Related U.S. Application Data

(60) Provisional application No. 62/711,887, filed on Jul. 30, 2018.

(51) Int. Cl.
*H03F 1/02* (2006.01)
*H03F 3/19* (2006.01)

(52) U.S. Cl.
CPC .......... *H03F 1/0227* (2013.01); *H03F 3/19* (2013.01); *H03F 2200/102* (2013.01); *H03F 2200/451* (2013.01)

(58) Field of Classification Search
CPC .................................................. H03F 1/0227
See application file for complete search history.

(56) References Cited

U.S. PATENT DOCUMENTS

| 2014/0009227 A1* | 1/2014 | Kay | H03F 3/3022 330/127 |
| 2014/0097895 A1* | 4/2014 | Khlat | H03F 3/45475 330/251 |
| 2014/0111170 A1* | 4/2014 | Shi | H02M 3/1588 323/271 |

(Continued)

OTHER PUBLICATIONS

Kelm, Robert, "Understanding Complex—Conjugate Poles in Filter Theory," Technical Article, allaboutcircuits.com/technical-articles/complex-conjugate-poles-in-filter-theory/, Aug. 30, 2016, EETech Media, LLC, 5 pages.

*Primary Examiner* — Patricia T Nguyen
(74) *Attorney, Agent, or Firm* — Withrow & Terranova, P.L.L.C.

(57) ABSTRACT

An envelope tracking (ET) voltage tracker circuit is provided. The ET voltage tracker circuit is configured to generate a time-variant voltage based on a time-variant target voltage, which further corresponds to a time-variant power envelope of a radio frequency (RF) signal. The time-variant voltage may be provided to an amplifier circuit(s) for amplifying the RF signal. The ET voltage tracker circuit includes a target voltage processing circuit configured to pre-process the time-variant target voltage. More specifically, the target voltage processing circuit is configured to pre-process the time-variant target voltage based on a high-order transfer function when the time-variant target voltage corresponds to a higher modulation bandwidth (e.g., >80 MHz). As a result, it may be possible to improve temporal alignment between the time-variant voltage and the time-variant target voltage at the amplifier circuit(s), thus allowing the amplifier circuit(s) to operate with improved efficiency and linearity.

22 Claims, 5 Drawing Sheets

(56) References Cited

U.S. PATENT DOCUMENTS

| | | | |
|---|---|---|---|
| 2014/0213196 A1* | 7/2014 | Langer | H03F 3/189 |
| | | | 455/73 |
| 2014/0361837 A1* | 12/2014 | Strange | H03F 1/0238 |
| | | | 330/297 |
| 2015/0031318 A1* | 1/2015 | McCallister | H03F 1/0222 |
| | | | 455/114.3 |
| 2016/0164550 A1* | 6/2016 | Pilgram | H03F 3/19 |
| | | | 375/295 |
| 2016/0277045 A1* | 9/2016 | Langer | H03L 7/087 |

* cited by examiner

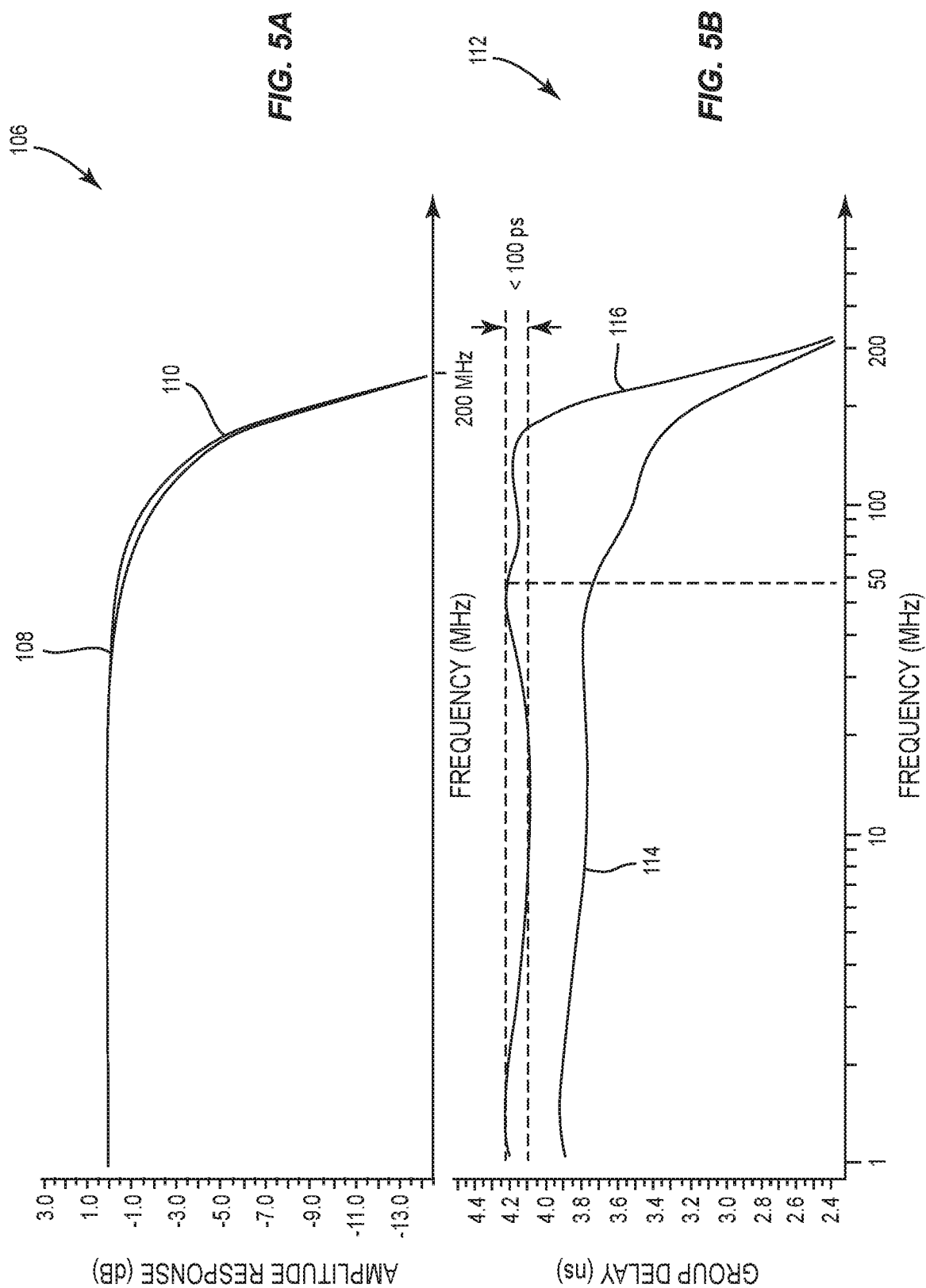

ENVELOPE TRACKING VOLTAGE TRACKER CIRCUIT

RELATED APPLICATIONS

This application claims the benefit of U.S. provisional patent application Ser. No. 62/711,887, filed on Jul. 30, 2018, the disclosure of which is incorporated herein by reference in its entirety.

FIELD OF THE DISCLOSURE

The technology of the disclosure relates generally to an envelope tracking (ET) amplifier apparatus in a wireless communication device.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE) and fifth-generation new-radio (5G-NR). To achieve the higher data rates in mobile communication devices, sophisticated power amplifiers may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking (ET) is a power management technology designed to improve efficiency levels of power amplifiers to help reduce power consumption and thermal dissipation in a mobile communication device. In an ET system, an ET power amplifier(s) amplifies an RF signal(s) based on time-variant voltages generated in accordance to time-variant amplitudes of the RF signal(s). The time-variant voltages increase as the time-variant amplitudes rise and decrease as the time-variant amplitudes fall. As such, the time-variant voltages correspond to a time-variant voltage envelope that tracks a time-variant power envelope associated with the time-variant signal amplitudes of the RF signal(s). Understandably, the better the time-variant voltage envelope tracks the time-variant power envelope, the higher efficiency can be achieved in the ET power amplifier(s). As such, it may be desired to ensure that the time-variant voltage envelope is consistently aligned with the time-variant power envelope at the ET power amplifier(s).

SUMMARY

Aspects disclosed in the detailed description include an envelope tracking (ET) voltage tracker circuit. The ET voltage tracker circuit is configured to generate a time-variant voltage based on a time-variant target voltage, which further corresponds to a time-variant power envelope of a radio frequency (RF) signal. In a non-limiting example, the time-variant voltage is provided to an amplifier circuit(s) for amplifying the RF signal to a desired power level. Notably, the amplifier circuit(s) may operate with improved efficiency and linearity when the time-variant voltage and the time-variant target voltage are temporally aligned at the amplifier circuit(s). In this regard, the ET voltage tracker circuit includes a target voltage processing circuit configured to pre-process the time-variant target voltage. More specifically, the target voltage processing circuit is configured to pre-process the time-variant target voltage based on a high-order transfer function (e.g., second-order complex-pole transfer function) when the time-variant target voltage corresponds to a higher modulation bandwidth (e.g., >80 MHz). As a result, it may be possible to improve temporal alignment between the time-variant voltage and the time-variant target voltage at the amplifier circuit(s), thus allowing the amplifier circuit(s) to operate with improved efficiency and linearity.

In one aspect, an ET voltage tracker circuit is provided. The ET voltage tracker circuit includes a voltage amplifier circuit configured to generate a time-variant voltage based on a time-variant target voltage. The ET voltage tracker circuit also includes a target voltage processing circuit configured to pre-process the time-variant target voltage to cause a group delay between the time-variant voltage and the time-variant target voltage being bounded by a pre-defined limit. The ET voltage tracker circuit also includes a controller configured to cause the target voltage processing circuit to pre-process the time-variant target voltage based on a predefined high-order transfer function in response to the time-variant target voltage corresponding to a first modulation bandwidth.

In another aspect, and ET amplifier apparatus is provided. The ET amplifier apparatus includes an amplifier circuit configured to amplify an RF signal based on a time-variant voltage. The ET amplifier apparatus also includes an ET voltage tracker circuit. The ET voltage tracker circuit includes a voltage amplifier circuit configured to generate a time-variant voltage based on a time-variant target voltage. The ET voltage tracker circuit also includes a target voltage processing circuit configured to pre-process the time-variant target voltage to cause a group delay between the time-variant voltage and the time-variant target voltage being bounded by a predefined limit. The ET voltage tracker circuit also includes a controller configured to cause the target voltage processing circuit to pre-process the time-variant target voltage based on a predefined high-order transfer function in response to the time-variant target voltage corresponding to a first modulation bandwidth.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

FIG. 5A is a graphic diagram providing an exemplary illustration of a first amplitude response curve and a second amplitude response curve corresponding to a first-order real-pole/real-zero transfer function and a second-order complex-pole transfer function, respectively; and FIG. 5B is a graphic diagram providing an exemplary illustration of a first group delay curve and a second group delay curve corresponding to the first-order real-pole/real-zero transfer function $H_F(s)$ and the second-order complex-pole transfer function $H_S(s)$ of FIG. 5A, respectively.

DETAILED DESCRIPTION

Figure 1A:
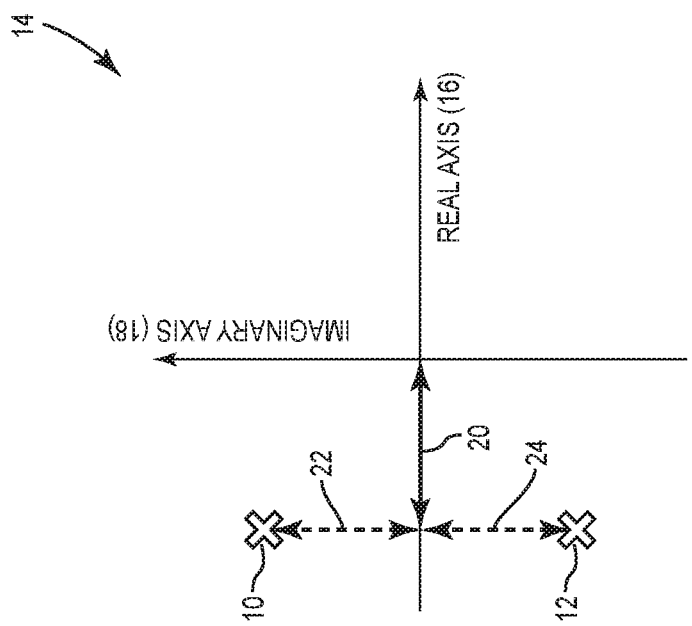
FIG. 1A is a graphic diagram providing an exemplary illustration of a pair of complex conjugate poles graphed in an s-plane.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an envelope tracking (ET) voltage tracker circuit. The ET voltage tracker circuit is configured to generate a time-variant voltage based on a time-variant target voltage, which further corresponds to a time-variant power envelope of a radio frequency (RF) signal. In a non-limiting example, the time-variant voltage is provided to an amplifier circuit(s) for amplifying the RF signal to a desired power level. Notably, the amplifier circuit(s) may operate with improved efficiency and linearity when the time-variant voltage and the time-variant target voltage are temporally aligned at the amplifier circuit(s). In this regard, the ET voltage tracker circuit includes a target voltage processing circuit configured to pre-process the time-variant target voltage. More specifically, the target voltage processing circuit is configured to pre-process the time-variant target voltage based on a high-order transfer function (e.g., second-order complex-pole transfer function) when the time-variant target voltage corresponds to a higher modulation bandwidth (e.g., >80 MHz). As a result, it may be possible to improve temporal alignment between the time-variant voltage and the time-variant target voltage at the amplifier circuit(s), thus allowing the amplifier circuit(s) to operate with improved efficiency and linearity.

Figure 1B:
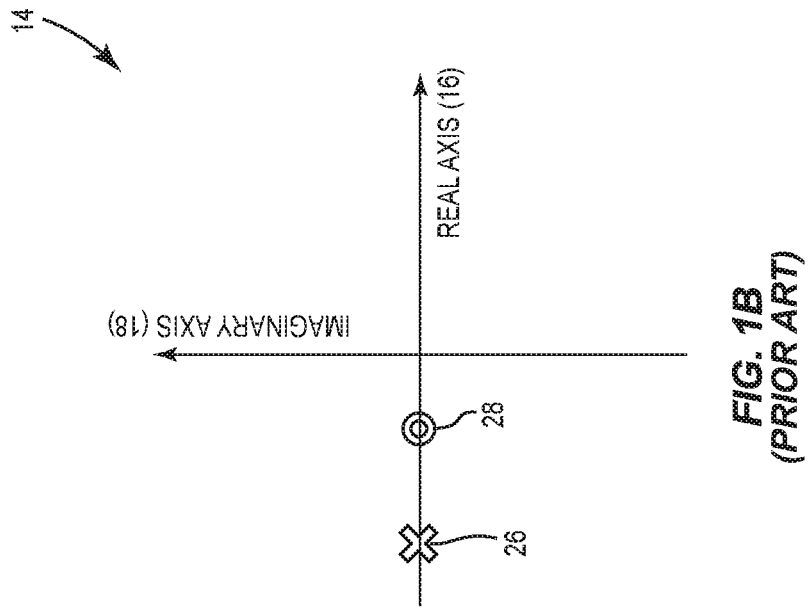
FIG. 1B is a graphic diagram providing an exemplary illustration of a real-pole and a real-zero as graphed in the s-plane of FIG. 1A.

Before discussing the ET voltage tracker circuit of the present disclosure, a brief overview of transfer function is first provided with reference to FIGS. 1A and 1B to help define a high-order transfer function (e.g., second-order complex-pole transfer function) and a first-order real-pole/real-zero transfer function. An overview of an existing ET amplifier apparatus is then provided with reference FIG. 2 to help understand how a trace inductance can cause group delay fluctuation in the existing ET amplifier apparatus. The discussion of specific exemplary aspects of an ET voltage tracker circuit of the present disclosure starts below with reference to FIG. 3.

A transfer function of a system, which is commonly denoted as H(s), can be expressed in the equation (Eq. 1) below.

$$H(s) = \frac{N(s)}{D(s)} \quad \text{(Eq. 1)}$$

In the equation (Eq. 1) above, N(s) and D(s) are simple polynomials that define a zero(s) and a pole(s) of the transfer function H(s), respectively. More specifically, the zero(s) is the root(s) of the polynomial N(s) and can be determined by solving the equation N(s)=0. In this regard, the order of the polynomial N(s) determines the number of zero(s) of the transfer function H(s). The zero(s) corresponds to a zero output(s) of the transfer function H(s). The polynomial N(s) is a zero-order polynomial when the polynomial N(s) represents a constant value and a first-order polynomial when the polynomial N(s) is equal to $1+b_0 s$.

In contrast, the pole(s) is the root(s) of the polynomial D(s) and can be determined by solving the equation D(s)=0. In this regard, the order of the polynomial D(s) determines the number of pole(s) of the transfer function H(s). The pole(s) corresponds to an infinite output(s) of the transfer function H(s). The polynomial D(s) is a zero-order polynomial when the polynomial D(s) represents a constant value and a first-order polynomial when the polynomial is equal to $1+a_0 s$. The polynomial D(s) becomes a second-order polynomial when the polynomial D(s) is equal to $1+a_0 s+a_1 s^2$, a third-order polynomial when the polynomial D(s) is equal to $1+a_0 s+a_1 s^2+a_2 s^3$, and so on. In this regard, the polynomial D(s) is a high-order polynomial when the polynomial D(s) is not a zero-order or a first-order polynomial. Accordingly, the transfer function H(s) becomes a high-order transfer function H(s) when the polynomial D(s) is the high-order polynomial. More specifically, the transfer function H(s) is hereinafter referred to as a second-order complex-pole transfer function when the polynomial D(s) is the second-order polynomial and a complex-pole/real-pole transfer function when the polynomial D(s) is the third-order polynomial.

In one example, N(s) can be a zero-order polynomial and D(s) can be a second-order polynomial. Accordingly, the transfer function H(s) becomes a second-order transfer function having two poles. When the two poles are complex conjugate poles (e.g., damping factor <1), the transfer function H(s) is hereinafter referred to as a second-order complex-pole transfer function. In contrast, when the two poles are real poles (e.g., damping factor >1), the transfer function H(s) is hereinafter referred to as a second-order real-pole transfer function.

FIG. 1A is a graphic diagram providing an exemplary illustration of a pair of complex conjugate poles 10, 12 graphed in an s-plane 14. The s-plane 14 is a complex plane for graphing Pierre-Simon Laplace (Laplace) transforms. The s-plane 14 includes a real axis 16 and an imaginary axis 18 perpendicular to the real axis 16. The complex conjugate poles 10, 12, as graphed in the s-plane 14, have real parts 20 that are equal in magnitude and sign. The complex conjugate poles 10, 12 have imaginary parts 22, 24, respectively. The imaginary parts 22, 24 are equal in magnitude, but opposing in sign.

In another example, N(s) and D(s) are both first order polynomials. Accordingly, the transfer function H(s) becomes a first-order transfer function with one pole and one zero. FIG. 1B is a graphic diagram providing an exemplary illustration of a real-pole 26 and a real-zero 28 as graphed in the s-plane 14 of FIG. 1A.

The real-pole 26 and the real-zero 28 are both located on the real axis 16. Although the real-pole 26 as shown is farther apart from the imaginary axis 18 than the real-zero 28, it is also possible for the real-pole 26 to be closer to the imaginary axis 18 than the real-zero 28. With the real-pole 26 and the real-zero 28 both located on the real axis 16, the transfer function H(s) is hereinafter referred to as a first-order real-pole/real-zero transfer function.

In another example, N(s) can be a first-order polynomial with real-pole/real-zero and D(s) can be a third-order polynomial with two complex poles and a real-pole. In this regard, the transfer function H(s) can be referred to as a "second-order complex-pole in series with first-order real-pole/real-zero" transfer function.

Figure 2:
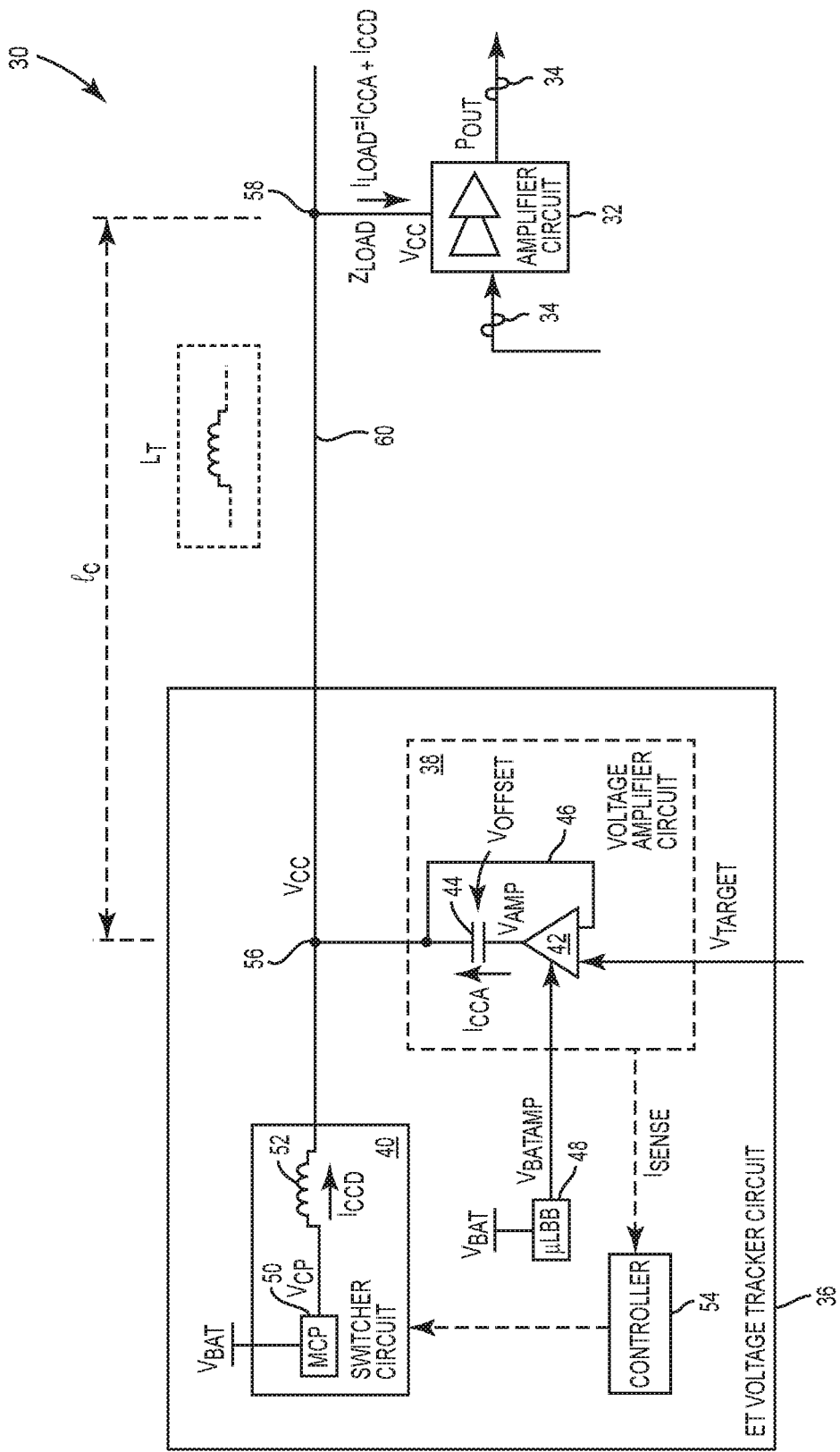
FIG. 2 is a schematic diagram of an exemplary existing envelope tracking (ET) amplifier apparatus in which an amplifier circuit can suffer degraded efficiency and linearity due to group delay associated with trace inductance.

FIG. 2 is a schematic diagram of an exemplary existing ET amplifier apparatus 30 in which an amplifier circuit 32 can suffer degraded efficiency and linearity due to group delay associated with trace inductance $L_T$. The amplifier circuit 32 is configured to amplify an RF signal 34 based on a time-variant voltage $V_{CC}$. The RF signal 34 may be modulated based on a defined modulation bandwidth and associated with a number of time-variant amplitudes that define a time-variant power envelope.

The existing ET amplifier apparatus 30 includes an ET voltage tracker circuit 36. The ET voltage tracker circuit 36 includes at least one voltage amplifier circuit 38 and at least one switcher circuit 40. The voltage amplifier circuit 38 includes a voltage amplifier 42 configured to generate a time-variant amplifier voltage $V_{AMP}$ based on a time-variant target voltage $V_{TARGET}$ and a supply voltage $V_{BATAMP}$. The time-variant target voltage $V_{TARGET}$ corresponds to a time-variant target voltage envelope that tracks the time-variant power envelope of the RF signal 34. In this regard, the time-variant target voltage $V_{TARGET}$ is modulated in accordance to the defined modulation bandwidth of the RF signal 34. Accordingly, the time-variant amplifier voltage $V_{AMP}$ is also modulated in accordance to the defined modulation bandwidth of the RF signal 34 and corresponds to a time-variant voltage envelope that rises and falls in accordance to the time-variant amplitudes of the RF signal 34.

The voltage amplifier circuit 38 may include an offset capacitor 44 coupled to the voltage amplifier 42. The offset capacitor 44 may be configured to raise the time-variant amplifier voltage $V_{AMP}$ by a defined offset voltage $V_{OFFSET}$ (e.g., 0.8 V) to generate the time-variant voltage $V_{CC}$ ($V_{CC}=V_{AMP}+V_{OFFSET}$). In this regard, the time-variant voltage $V_{CC}$ corresponds to the time-variant voltage envelope of the time-variant amplifier voltage $V_{AMP}$. Given that the time-variant amplifier voltage $V_{AMP}$ tracks the time-variant amplitudes, and thus the time-variant power envelope of the RF signal 34, the time-variant voltage $V_{CC}$ also tracks the time-variant power envelope of the RF signal 34.

The amplifier circuit 32 may have an inherent load impedance $Z_{LOAD}$ that can cause a load current $I_{LOAD}$ based on the time-variant voltage $V_{CC}$. In this regard, the amplifier circuit 32 may act like a current source/sink to the ET voltage tracker circuit 36. Given that the time-variant voltage $V_{CC}$ rises and falls in accordance to the time-variant power envelope of the RF signal 34, the load current $I_{LOAD}$ may likewise rise or fall based on the time-variant power amplitude of the RF signal 34. Accordingly, the amplifier circuit 32 may output the RF signal 34 at a desired output power $P_{OUT}$ that is positively related to the load current $I_{LOAD}$ and the load impedance $Z_{LOAD}$.

The voltage amplifier circuit 38 may include a feedback loop 46 configured to provide a sample of the time-variant voltage $V_{CC}$ back to the voltage amplifier 42. In this regard, the voltage amplifier 42 may be referred to as a closed-loop voltage amplifier. The ET voltage tracker circuit 36 may include a micro inductor-based buck-boost (μLBB) circuit 48 configured to generate the supply voltage $V_{BATAMP}$ based on a battery voltage $V_{BAT}$. As the name suggests, the μLBB circuit 48 may operate in a buck mode to output the supply voltage $V_{BATAMP}$ at the battery voltage $V_{BAT}$ or in a boost mode to output the supply voltage $V_{BATAMP}$ at two-times the battery voltage $V_{BAT}$ (2×$V_{BAT}$).

The switcher circuit 40 includes a multi-level charge pump (MCP) 50 configured to generate a multi-level voltage $V_{CP}$ based on the battery voltage $V_{BAT}$. The MCP 50 may be configured to generate the multi-level voltage $V_{CP}$ at 0 V, $V_{BAT}$, or 2×$V_{BAT}$. The switcher circuit 40 may include a current inductor 52 coupled in series to the MCP 50. The current inductor 52 may be configured to induce a low-frequency current $I_{CCD}$ based on the multi-level voltage $V_{CP}$. The current inductor 52 may inherently have a relatively large inductance. Accordingly, the current inductor 52 may generate the low-frequency current $I_{CCD}$ closer to a direct current (DC).

When the RF signal 34 is modulated in a lower modulation bandwidth (e.g., 80 MHz), the load current $I_{LOAD}$ may be constituted entirely by the low-frequency current $I_{CCD}$. However, when the RF signal 34 is modulated in a higher modulation bandwidth (e.g., >80 MHz), the low-frequency current $I_{CCD}$ may not be sufficient for the amplifier circuit 32 to amplify the RF signal 34 to the desired output power $P_{OUT}$, particularly when the time-variant power envelope of the RF signal 34 swings rapidly between peak and bottom power levels. As a result, the voltage amplifier 42 may be forced to source an alternate current $I_{CCA}$ to make up the deficit of the low-frequency $I_{CCD}$. In contrast, when the RF signal 34 remains at a relatively stable power level, the low-frequency current $I_{CCD}$ may be sufficient for the amplifier circuit 32 to amplify the RF signal 34 to the desired output power $P_{OUT}$. As such, the voltage amplifier 42 may be forced to act as a current sink to absorb excessive alternate current.

In this regard, the voltage amplifier circuit 38 may be configured to generate a sense current $I_{SENSE}$ indicative of the alternate current $I_{CCA}$ sourced or sunk by the voltage amplifier 42. The ET voltage tracker circuit 36 may include a controller 54, which can be a bang-bang controller (BBC) for example. The controller 54 may receive the sense current $I_{SENSE}$ from the voltage amplifier circuit 38. Accordingly, the controller 54 may control the switcher circuit 40 to adjust (increase or decrease) the low-frequency current $I_{CCD}$.

The voltage amplifier circuit 38 may be configured to generate the time-variant voltage $V_{CC}$ at a first coupling node 56. The amplifier circuit 32, on the other hand, may be coupled to a second coupling node 58 to receive the time-variant voltage $V_{CC}$. The first coupling node 56 may be coupled to the second coupling node 58 via a conductive trace 60 over a coupling distance $l_C$. In this regard, the conductive trace 60 can inherently cause the trace inductance $L_T$ when the load current $I_{LOAD}$ flows through the conductive trace 60 over the coupling distance $l_C$. In addition, the voltage amplifier circuit 38 may include conductive traces that can add additional trace inductance to the trace inductance $L_T$. In this regard, the trace inductance $L_T$ may be seen as a lump sum trace inductance between the voltage amplifier circuit 38 and the amplifier circuit 32.

The trace inductance $L_T$ may cause a trace voltage $V_L$ across the conductive trace 60, as can be determined based on the equation (Eq. 2) below.

$$V_L = -L_T \frac{\Delta I_{LOAD}}{\Delta t} \qquad (\text{Eq. 2})$$

In the equation (Eq. 2) above, $\Delta I_{LOAD}/\Delta t$ represents a time-variant change of the load current $I_{LOAD}$. Notably, the trace voltage $V_L$ can cause the time-variant voltage $V_{CC}$ to fluctuate at the second coupling node 58. As such, the time-variant voltage $V_{CC}$ may be out of alignment with the time-variant power envelope of the RF signal 34 at the amplifier circuit 32, thus causing increased group delay fluctuation between the voltage amplifier circuit 38 and the amplifier circuit 32. In a non-limiting example, group delay refers to temporal delay between the time-variant voltage $V_{CC}$ and the time-variant target voltage $V_{TARGET}$ at the amplifier circuit 32. Notably, the group delay may be a function of the modulation bandwidth of the RF signal 34. In this regard, the group delay fluctuation may worsen when the modulation bandwidth of the RF signal 34 increases beyond a defined threshold (e.g., >80 MHz). Consequently, the amplifier circuit 32 may suffer degraded efficiency and linearity. Therefore, it may be desired to flatten the group delay between the time-variant voltage $V_{CC}$ and the time-variant target voltage $V_{TARGET}$ to help improve efficiency and linearity of the amplifier circuit 32.

Figure 3:
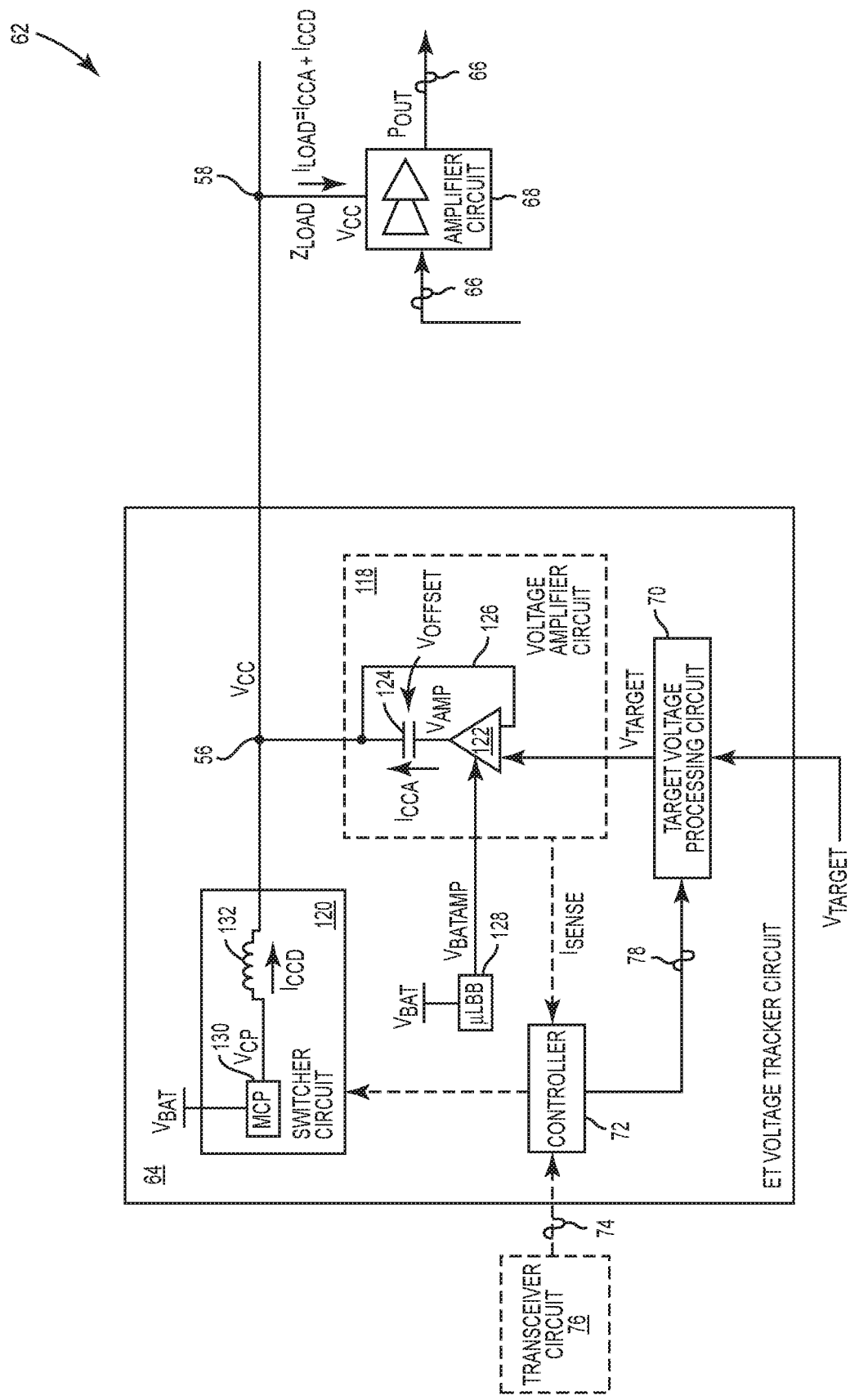
FIG. 3 is a schematic diagram of an exemplary ET amplifier apparatus including an ET voltage tracker circuit configured according to an embodiment of the present disclosure to help maintain group delay flatness between a time-variant voltage and a time-variant target voltage across a wider modulation bandwidth.

In this regard, FIG. 3 is a schematic diagram of an exemplary ET amplifier apparatus 62 including an ET voltage tracker circuit 64 configured according to an embodiment of the present disclosure to help maintain group delay flatness between a time-variant voltage $V_{CC}$ and a time-variant target voltage $V_{TARGET}$ across a wider modulation bandwidth. In a non-limiting example, a group delay refers to a temporal misalignment between the time-variant voltage $V_{CC}$ and the time-variant target voltage $V_{TARGET}$. In this regard, maintaining group delay flatness between the time-variant voltage $V_{CC}$ and the time-variant target voltage $V_{TARGET}$ means that the group delay between the time-variant voltage $V_{CC}$ and the time-variant target voltage $V_{TARGET}$ is bounded by a predefined limit. In a non-limiting example, the predefined limit can be 100 picoseconds (ps).

As discussed in details below, the ET voltage tracker circuit 64 is configured to pre-process the time-variant target voltage $V_{TARGET}$ based on a selected transfer function. More specifically, the transfer function is selected based on a modulation bandwidth of the time-variant target voltage $V_{TARGET}$. In a non-limiting example, the modulation bandwidth of the time-variant target voltage $V_{TARGET}$ corresponds to a signal modulation bandwidth of an RF signal 66 that is amplified by an amplifier circuit 68 in the ET amplifier apparatus 62 based on the time-variant voltage $V_{CC}$. In examples discussed herein, the ET voltage tracker circuit 64 is configured to pre-process the time-variant target voltage $V_{TARGET}$ based on a predefined high-order transfer function $H_S(s)$, such as the second-order complex-pole transfer function H(s) in FIG. 1A, when the time-variant target voltage $V_{TARGET}$ corresponds to a first modulation bandwidth (e.g., >80 MHz). The ET voltage tracker circuit 64 is further configured to pre-process the time-variant target voltage $V_{TARGET}$ based on a predefined first-order real-pole/real-zero transfer function $H_F(s)$, such as the first-order real-pole/real-zero transfer function H(s) in FIG. 1B, when the time-variant target voltage $V_{TARGET}$ corresponds to a second modulation bandwidth (e.g., 50 MHz). By pre-processing the time-variant target voltage $V_{TARGET}$ based on the selected transfer function depending on the modulation bandwidth, it may be possible to maintain group delay flatness across wider modulation bandwidth (e.g., up to 200 MHz), thus helping to improve efficiency and linearity of the amplifier circuit 68.

The ET voltage tracker circuit 64 includes a target voltage processing circuit 70 configured to pre-process the time-variant target voltage $V_{TARGET}$ based on the selected transfer function. The ET voltage tracker circuit 64 includes a controller 72, which can be a BBC for example. The controller 72 may be configured to cause the target voltage processing circuit to pre-process the time-variant target voltage $V_{TARGET}$ based on the predefined high-order transfer function $H_S(s)$ when the time-variant target voltage $V_{TARGET}$ corresponds to the first modulation bandwidth. In one non-limiting example, the high-order transfer function $H_S(s)$ can be a second-order complex-pole transfer function. In another non-limiting example, the high-order transfer function can be a complex-pole/real-pole transfer function. In another non-limiting example, the high-order transfer function can be a second-order complex-pole in series with first-order real-pole/real-zero transfer function. Alternatively, the controller 72 may be configured to cause the target voltage processing circuit to pre-process the time-variant target voltage $V_{TARGET}$ based on the predefined first-order real-pole/real-zero transfer function $H_F(s)$ when the time-variant target voltage VTARGET corresponds to the second modulation bandwidth.

The controller 72 may receive an indication signal 74, for example, from a transceiver circuit 76. The indication signal 74 may be indicative of whether the time-variant target voltage $V_{TARGET}$ corresponds to the first modulation bandwidth or the second modulation bandwidth. Notably, the modulation bandwidth of the time-variant target voltage $V_{TARGET}$ may be related to the modulation bandwidth of the RF signal 66. As such, the indication signal 74 may also be further configured to indicate the modulation bandwidth of the RF signal 66. The controller 72 may be configured to provide a control signal 78 to the target voltage processing circuit 70 in response to receiving the indication signal 74. In one example, the control signal 78 can provide an indication of the selected transfer function to be employed by the target voltage processing circuit 70 for pre-processing the time-variant target voltage $V_{TARGET}$. Accordingly, the target voltage processing circuit 70 may retrieve configuration parameters related to the selected transfer function from internal and/or external registers. In another example, the control signal 78 may include the configuration parameters related to the select transfer function for configuring the target voltage processing circuit 70 to pre-process the time-variant target voltage $V_{TARGET}$.

Figure 4:
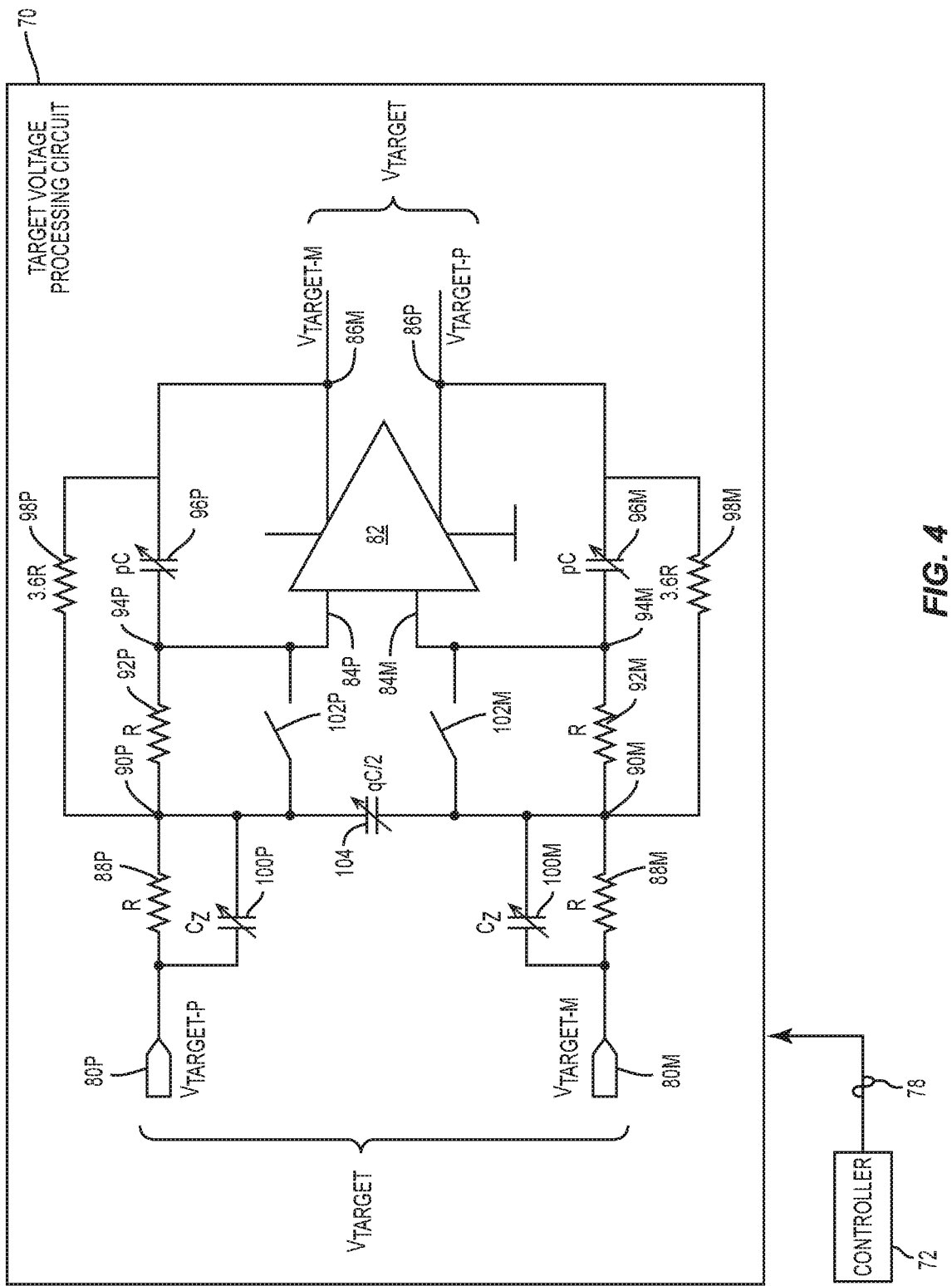
FIG. 4 is a schematic diagram providing an exemplary illustration of a target voltage processing circuit in the ET voltage tracker circuit of FIG. 3 configured to pre-process the time-variant target voltage to help maintain group delay flatness across a wider modulation bandwidth.

To help explain how the target voltage processing circuit 70 can be configured to pre-process the time-variant target voltage $V_{TARGET}$ based on the selected transfer function, FIG. 4 is discussed next. In this regard, FIG. 4 is a schematic diagram providing an exemplary illustration of the target voltage processing circuit 70 of FIG. 3 configured to pre-process the time-variant target voltage $V_{TARGET}$ to help maintain group delay flatness across a wider modulation bandwidth. Common elements between FIGS. 3 and 4 are shown therein with common element numbers and will not be re-described herein.

In a non-limiting example, the time-variant target voltage $V_{TARGET}$ can be a differential voltage consisting of a time-variant plus target voltage $V_{TARGET-P}$ and a time-variant minus target voltage $V_{TARGET-M}$. In this regard, the target voltage processing circuit 70 includes a plus voltage input 80P and a minus voltage input 80M configured to receive the time-variant plus target voltage $V_{TARGET-P}$ and the time-variant minus target voltage $V_{TARGET-M}$, respectively. The target voltage processing circuit 70 also includes a differential amplifier 82. The differential amplifier 82 includes a plus input 84P and a minus input 84M configured to receive the time-variant plus target voltage $V_{TARGET-P}$ and the time-variant minus target voltage $V_{TARGET-M}$, respectively. The differential amplifier 82 also includes a plus output 86P and a minus output 86M configured to output the time-variant plus target voltage $V_{TARGET-P}$ and the time-variant minus target voltage $V_{TARGET-M}$, respectively.

The target voltage processing circuit 70 includes a first plus resistor 88P coupled between the plus voltage input 80P and a first plus coupling node 90P. The first plus resistor 88P has a respective resistance denoted as "R" in FIG. 4. The target voltage processing circuit 70 includes a second plus resistor 92P coupled between the first plus coupling node 90P and a second plus coupling node 94P and in series to the first plus resistor 88P. The second plus resistor 92P has a respective resistance denoted as "R" in FIG. 4. The target voltage processing circuit 70 includes a first plus adjustable capacitor 96P coupled between the second plus coupling node 94P and the minus output 86M and in series to the second plus resistor 92P. The first plus adjustable capacitor 96P has a respective capacitance denoted as "pC" in FIG. 4, wherein "p" represents a first capacitance adjustment factor greater than zero. The target voltage processing circuit 70 includes a third plus resistor 98P coupled between the minus output 86M and the first plus coupling node 90P. The third plus resistor 98P is provided in parallel to the second plus resistor 92P and the first plus adjustable capacitor 96P. In a non-limiting example, the third plus resistor 98P has a respective resistance that equals 3.6R, wherein "R" represents the respective resistance of the first plus resistor 88P and the second plus resistor 92P. The target voltage processing circuit 70 includes a second plus adjustable capacitor 100P coupled between the plus voltage input 80P and the first plus coupling node 90P in parallel to the first plus resistor 88P. The second plus adjustable capacitor 100P has a respective capacitance denoted as "$C_Z$" in FIG. 4. The target voltage processing circuit 70 includes a plus bypass switch 102P coupled between the first plus coupling node 90P and the second plus coupling node 94P in parallel to the second plus resistor 92P.

The target voltage processing circuit 70 includes a first minus resistor 88M coupled between the minus voltage input 80M and a first minus coupling node 90M. The first minus resistor 88M has a respective resistance denoted as "R" in FIG. 4. The target voltage processing circuit 70 includes a second minus resistor 92M coupled between the first minus coupling node 90M and a second minus coupling node 94M and in series to the first minus resistor 88M. The second minus resistor 92M has a respective resistance denoted as "R" in FIG. 4. The target voltage processing circuit 70 includes a first minus adjustable capacitor 96M coupled between the second minus coupling node 94M and the plus output 86P and in series to the second minus resistor 92M. The first minus adjustable capacitor 96M has a respective capacitance denoted as "pC" in FIG. 4, wherein "p" represents the first capacitance adjustment factor greater than zero. The target voltage processing circuit 70 includes a third minus resistor 98M coupled between the plus output 86P and the first minus coupling node 90M. The third minus resistor 98M is provided in parallel to the second minus resistor 92M and the first minus adjustable capacitor 96M. In a non-limiting example, the third minus resistor 98M has a respective resistance that equals 3.6R, wherein "R" represents the respective resistance of the first minus resistor 88M and the second minus resistor 92M. The target voltage processing circuit 70 includes a second minus adjustable capacitor 100M coupled between the minus voltage input 80M and the first minus coupling node 90M and in parallel to the first minus resistor 88M. The second minus adjustable capacitor 100M has a respective capacitance denoted as "$C_Z$" in FIG. 4. The target voltage processing circuit 70 includes a minus bypass switch 102M coupled between the first minus coupling node 90M and the second minus coupling node 94M and in parallel to the second minus resistor 92M.

The target voltage processing circuit further includes an adjustable capacitor 104 coupled between the first plus coupling node 90P and the first minus coupling node 90M. The adjustable capacitor 104 has a respective adjustable capacitance denoted as "qC/2" in FIG. 4, wherein "q" represents a second capacitance adjustment factor greater than zero.

In one non-limiting example, the controller 72 can cause the target voltage processing circuit 70 to open the plus bypass switch 102P and the minus bypass switch 102M in response to the time-variant target voltage $V_{TARGET}$ corresponding to the first modulation bandwidth (e.g., >80 MHz). Accordingly, the target voltage processing circuit 70 can be configured to pre-process the time-variant target voltage $V_{TARGET}$ based on the second-order complex-pone transfer function $H_S(s)$ as expressed in the equation (Eq. 3) below.

$$H_s(s) = \frac{3.6}{1 + 8.2pRCs + 3.6pqR^2C^2s^2} \quad \text{(Eq. 3)}$$

In the equation (Eq. 3) above, "R" represents the respective resistance of the first plus resistor 88P, the second plus resistor 92P, the first minus resistor 88M, and the second minus resistor 92M, "C" represents the respective capacitance of the first plus adjustable capacitor 96P, the first minus adjustable capacitor 96M, and the adjustable capacitor 104, "p" represents the first capacitance adjustment factor, and "q" represents the second capacitance adjustment factor.

The second-order complex-pole transfer function $H_S(s)$ may be further controlled based on a first set parameter consisting of such parameters as the first capacitance adjustment factor "p" for the first plus adjustable capacitor 96P and the first minus adjustable capacitor 96M and the second capacitance adjustment factor "q" for the adjustable capacitor 104. In one embodiment, the controller 72 may provide the first set parameter to the target voltage processing circuit 70 via the control signal 78 and the target voltage processing circuit 70 can set the first capacitance adjustment factor "p" and/or the second capacitance adjustment factor "q" accordingly. Alternatively, the target voltage processing circuit 70 may pre-store the first set parameter locally (e.g., in registers) and retrieve the first set parameter based on the control signal 78. Notably, the first set parameter may be determined based on the trace inductance $L_T$ in the ET amplifier apparatus 62 of FIG. 3.

In another non-limiting example, the controller 72 can cause the target voltage processing circuit 70 to close the plus bypass switch 102P and the minus bypass switch 102M in response to the time-variant target voltage $V_{TARGET}$ corresponding to the second modulation bandwidth (e.g., 80 MHz). Accordingly, the target voltage processing circuit 70 can be configured to pre-process the time-variant target voltage $V_{TARGET}$ based on the first-order real-pole/real-zero transfer function $H_F(s)$ as expressed in the equation (Eq. 4) below.

$$H_F(s) = \frac{3.6^*(1 + RC_Z s)}{1 + 3.6pRCs} \quad \text{(Eq. 4)}$$

In the equation (Eq. 4) above, "R" represents the respective resistance of the first plus resistor 88P, the second plus resistor 92P, the first minus resistor 88M, and the second minus resistor 92M, "C" represents the respective capacitance of the first plus adjustable capacitor 96P, the first minus adjustable capacitor 96M, and the adjustable capacitor 104, "$C_Z$" represents the respective capacitance of the second plus adjustable capacitor 100P and the second minus adjustable capacitor 100M, and "p" represents the first capacitance adjustment factor.

The first-order real-pole/real-zero transfer function $H_F(s)$ may be further controlled based on a second set parameter consisting of such parameters as the first capacitance adjustment factor "p" for the first plus adjustable capacitor 96P and the first minus adjustable capacitor 96M and respective adjustable capacitance "$C_Z$" for the second plus adjustable capacitor 100P and the second minus adjustable capacitor 100M. In one embodiment, the controller 72 may provide the second set parameter to the target voltage processing circuit 70 via the control signal 78 and the target voltage processing circuit 70 can set the first capacitance adjustment factor "p" and/or the adjustable capacitance "$C_Z$" accordingly. Alternatively, the target voltage processing circuit 70 may pre-store the second set parameter locally (e.g., in registers) and retrieve the second set parameter based on the control signal 78. Notably, the second set parameter may be determined based on the trace inductance $L_T$ in the ET amplifier apparatus 62 of FIG. 3.

The target voltage processing circuit 70 can help maintain group delay flatness without altering an amplitude response of the time-variant voltage $V_{CC}$, as discussed next in FIGS. 5A and 5B. In this regard, FIG. 5A is a graphic diagram 106 providing an exemplary illustration of a first amplitude response curve 108 and a second amplitude response curve 110 corresponding to the first-order real-pole/real-zero transfer function $H_F(s)$ and the second-order complex-pole transfer function $H_S(s)$, respectively. As shown in FIG. 5A, the first amplitude response curve 108 and the second amplitude response curve 110 are in good agreement. This is an indication that the amplitude response of the time-variant voltage $V_{CC}$ is not affected when the target voltage processing circuit 70 toggles between the first-order real-pole/real-zero transfer function $H_F(s)$ and the second-order complex-pole transfer function $H_S(s)$.

FIG. 5B is a graphic diagram 112 providing an exemplary illustration of a first group delay curve 114 and a second group delay curve 116 corresponding to the first-order real-pole/real-zero transfer function $H_F(s)$ and the second-order complex-pole transfer function $H_S(s)$ of FIG. 5A, respectively. According to the first group delay curve 114, the target voltage processing circuit 70 may be able to maintain good group delay flatness up to around 50 MHz based on the first-order real-pole/real-zero transfer function $H_F(s)$. However, the group delay flatness begins to deteriorate rapidly above 50 MHz. In contrast, as illustrated by the second group delay curve 116, the target voltage processing circuit 70 may be able to maintain good group delay flatness up to around 200 MHz. In this regard, it may be desired to configure the target voltage processing circuit 70 to pre-process the time-variant target voltage $V_{TARGET}$ based on the second-order complex-pole transfer function $H_S(s)$ when the time-variant target voltage $V_{TARGET}$ corresponds to more than 50 MHz modulation bandwidth.

With reference back to FIG. 3, the ET voltage tracker circuit 64 includes at least one voltage amplifier circuit 118 and at least one switcher circuit 120. The voltage amplifier circuit 118 includes a voltage amplifier 122 configured to generate a time-variant amplifier voltage $V_{AMP}$ based on the time-variant target voltage $V_{TARGET}$ and a supply voltage $V_{BATAMP}$. The voltage amplifier circuit 118 may include an offset capacitor 124 coupled to the voltage amplifier 122. The offset capacitor 124 may be configured to raise the time-variant amplifier voltage $V_{AMP}$ by a defined offset voltage $V_{OFFSET}$ (e.g., 0.8 V) to generate the time-variant voltage $V_{CC}$ ($V_{CC}=V_{AMP}+V_{OFFSET}$). The voltage amplifier circuit 118 may include a feedback loop 126 configured to provide a sample of the time-variant voltage $V_{CC}$ back to the voltage amplifier 122.

The ET voltage tracker circuit 64 may include a µLBB circuit 128 configured to generate the supply voltage $V_{BATAMP}$ based on a battery voltage $V_{BAT}$. As the name suggests, the µLBB circuit 128 may operate in a buck mode to output the supply voltage $V_{BATAMP}$ at the battery voltage $V_{BAT}$ or in a boost mode to output the supply voltage $V_{BATAMP}$ at two-times the battery voltage $V_{BAT}$ ($2 \times V_{BAT}$).

The amplifier circuit 68 may have inherent load impedance $Z_{LOAD}$ that can cause a load current $I_{LOAD}$ based on the time-variant voltage $V_{CC}$. In this regard, the amplifier circuit 68 may act like a current source/sink to the ET voltage tracker circuit 64. Given that the time-variant voltage $V_{CC}$ rises and falls in accordance to the time-variant power envelope of the RF signal 66, the load current $I_{LOAD}$ may likewise rise or fall based on the time-variant power amplitude of the RF signal 66. Accordingly, the amplifier circuit 69 may output the RF signal 66 at a desired output power $P_{OUT}$ that is positively related to the load current $I_{LOAD}$ and the load impedance $Z_{LOAD}$.

The switcher circuit 120 includes an MCP 130 configured to generate a multi-level voltage $V_{CP}$ based on the battery voltage $V_{BAT}$. The MCP 130 may be configured to generate the multi-level voltage $V_{CP}$ at 0 V, $V_{BAT}$, or $2 \times V_{BAT}$. The switcher circuit 120 may include a current inductor 132 coupled in series to the MCP 130. The current inductor 132 may be configured to induce a low-frequency current $I_{CCD}$ based on the multi-level voltage $V_{CP}$. The current inductor 132 may inherently have a relatively large inductance. Accordingly, the current inductor 132 may generate the low-frequency current $I_{CCD}$ closer to a direct current (DC).

When the RF signal 66 is modulated in a lower modulation bandwidth (e.g., 80 MHz), the load current $I_{LOAD}$ may be constituted entirely by the low-frequency current $I_{CCD}$. However, when the RF signal 66 is modulated in a higher modulation bandwidth (e.g., >80 MHz), the low-frequency current $I_{CCD}$ may not be sufficient for the amplifier circuit 68 to amplify the RF signal 66 to the desired output power $P_{OUT}$, particularly when the time-variant power envelope of the RF signal 66 swings rapidly between peak and bottom power levels. As a result, the voltage amplifier 122 may be forced to source an alternate current $I_{CCA}$ to make up the deficit of the low-frequency $I_{CCD}$. In contrast, when the RF signal 66 remains at a relatively stable power level, the low-frequency current $I_{CCD}$ may be sufficient for the amplifier circuit 68 to amplify the RF signal 66 to the desired output power $P_{OUT}$. As such, the voltage amplifier 122 may be forced to act as a current sink to absorb excessive alternate current.

In this regard, the voltage amplifier circuit 118 may be configured to generate a sense current $I_{SENSE}$ indicative of the alternate current $I_{CCA}$ sourced or sunk by the voltage amplifier 122. The controller 72 may receive the sense current $I_{SENSE}$ from the voltage amplifier circuit 118. Accordingly, the controller 72 may control the switcher circuit 120 to adjust (increase or decrease) the low-frequency current $I_{CCD}$.

Those skilled in the art will recognize improvements and modifications to the embodiments of the present disclosure. All such improvements and modifications are considered within the scope of the concepts disclosed herein and the claims that follow.

What is claimed is:

1. An envelope tracking (ET) voltage tracker circuit comprising:
   a voltage amplifier circuit configured to generate a time-variant voltage based on a time-variant target voltage;
   a target voltage processing circuit configured to pre-process the time-variant target voltage to cause a group delay between the time-variant voltage and the time-variant target voltage being bounded by a predefined limit; and
   a controller configured to cause the target voltage processing circuit to pre-process the time-variant target voltage based on a predefined high-order transfer function in response to the time-variant target voltage corresponding to a first modulation bandwidth.

2. The ET voltage tracker circuit of claim 1 wherein the predefined high-order transfer function is a transfer function selected from the group consisting of: a second-order complex-pole transfer function, a complex-pole/real-pole transfer function, and a second-order complex-pole in series with first-order real-pole/real-zero transfer function.

3. The ET voltage tracker circuit of claim 1 wherein the controller is further configured to cause the target voltage processing circuit to pre-process the time-variant target voltage based on a predefined first-order real-pole/real-zero transfer function in response to the time-variant target voltage corresponding to a second modulation bandwidth lower than the first modulation bandwidth.

4. The ET voltage tracker circuit of claim 3 wherein the controller is further configured to receive an indication signal indicative of the time-variant target voltage corresponding to the first modulation bandwidth or the second modulation bandwidth.

5. The ET voltage tracker circuit of claim 3 wherein the target voltage processing circuit comprises:
   a plus voltage input configured to receive a time-variant plus target voltage;
   a minus voltage input configured to receive a time-variant minus target voltage; and
   a differential amplifier comprising:
     a plus input configured to receive the time-variant plus target voltage;
     a minus input configured to receive the time-variant minus target voltage;
     a plus output configured to provide the time-variant plus target voltage to the voltage amplifier circuit; and
     a minus output configured to provide the time-variant minus target voltage to the voltage amplifier circuit.

6. The ET voltage tracker circuit of claim 5 wherein the target voltage processing circuit further comprises:
   a plus bypass switch coupled between the plus voltage input and the plus input of the differential amplifier; and
   a minus bypass switch coupled between the minus voltage input and the minus input of the differential amplifier.

7. The ET voltage tracker circuit of claim 6 wherein the controller is further configured to open the plus bypass switch and the minus bypass switch to cause the target voltage processing circuit to pre-process the time-variant target voltage based on the predefined high-order transfer function in response to the time-variant target voltage corresponding to the first modulation bandwidth.

8. The ET voltage tracker circuit of claim 6 wherein the controller is further configured to close the plus bypass switch and the minus bypass switch to cause the target voltage processing circuit to pre-process the time-variant target voltage based on the predefined first-order real-pole/real-zero transfer function in response to the time-variant target voltage corresponding to the second modulation bandwidth.

9. The ET voltage tracker circuit of claim 6 wherein the target voltage processing circuit further comprises:
a first plus resistor coupled between the plus voltage input and a first plus coupling node;
a second plus resistor coupled between the first plus coupling node and a second plus coupling node in series to the first plus resistor;
a first plus adjustable capacitor coupled between the second plus coupling node and the minus output in series to the second plus resistor;
a third plus resistor coupled between the minus output and the first plus coupling node in parallel to the first plus adjustable capacitor and the second plus resistor;
a second plus adjustable capacitor coupled between the plus voltage input and the first plus coupling node in parallel to the first plus resistor;
a first minus resistor coupled between the minus voltage input and a first minus coupling node;
a second minus resistor coupled between the first minus coupling node and a second minus coupling node in series to the first minus resistor;
a first minus adjustable capacitor coupled between the second minus coupling node and the plus output in series to the second minus resistor;
a third minus resistor coupled between the plus output and the first minus coupling node in parallel to the first minus adjustable capacitor and the second minus resistor;
a second minus adjustable capacitor coupled between the minus voltage input and the first minus coupling node in parallel to the first minus resistor; and
an adjustable capacitor coupled between the first plus coupling node and the first minus coupling node;
wherein the plus bypass switch is coupled between the first plus coupling node and the second plus coupling node in parallel to the second plus resistor; and
wherein the minus bypass switch is coupled between the first minus coupling node and the second minus coupling node in parallel to the second minus resistor.

10. The ET voltage tracker circuit of claim 9 wherein the controller is further configured to:
store a first set parameter for causing the target voltage processing circuit to pre-process the time-variant target voltage based on the predefined high-order transfer function;
store a second set parameter for causing the target voltage processing circuit to pre-process the time-variant target voltage based on the predefined first-order real-pole/real-zero transfer function;
retrieve the first set parameter and configure the target voltage processing circuit based on the first set parameter in response to the time-variant target voltage corresponding to the first modulation bandwidth; and
retrieve the second set parameter and configure the target voltage processing circuit based on the second set parameter in response to the time-variant target voltage corresponding to the second modulation bandwidth.

11. The ET voltage tracker circuit of claim 10 wherein:
the first set parameter comprises one or more first parameters related to the first plus adjustable capacitor, the first minus adjustable capacitor, and the adjustable capacitor; and
the second set parameter comprises one or more second parameters related to the first plus adjustable capacitor and the first minus adjustable capacitor.

12. An envelope tracking (ET) amplifier apparatus comprising:
an amplifier circuit configured to amplify a radio frequency (RF) signal based on a time-variant voltage; and
an ET voltage tracker circuit comprising:
a voltage amplifier circuit configured to generate the time-variant voltage based on a time-variant target voltage;
a target voltage processing circuit configured to pre-process the time-variant target voltage to cause a group delay between the time-variant voltage and the time-variant target voltage being bound by a predefined limit; and
a controller configured to cause the target voltage processing circuit to pre-process the time-variant target voltage based on a predefined high-order transfer function in response to the time-variant target voltage corresponding to a first modulation bandwidth.

13. The ET amplifier apparatus of claim 12 wherein the predefined high-order transfer function is a transfer function selected from the group consisting of: a second-order complex-pole transfer function, a complex-pole/real-pole transfer function, and a second-order complex-pole in series with first-order real-pole/real-zero transfer function.

14. The ET amplifier apparatus of claim 12 wherein the controller is further configured to cause the target voltage processing circuit to pre-process the time-variant target voltage based on a predefined first-order real-pole/real-zero transfer function in response to the time-variant target voltage corresponding to a second modulation bandwidth lower than the first modulation bandwidth.

15. The ET amplifier apparatus of claim 14 wherein the controller is further configured to receive an indication signal indicative of the time-variant target voltage corresponding to the first modulation bandwidth or the second modulation bandwidth.

16. The ET amplifier apparatus of claim 14 wherein the target voltage processing circuit comprises:
a plus voltage input configured to receive a time-variant plus target voltage;
a minus voltage input configured to receive a time-variant minus target voltage; and
a differential amplifier comprising:
a plus input configured to receive the time-variant plus target voltage;
a minus input configured to receive the time-variant minus target voltage;
a plus output configured to provide the time-variant plus target voltage to the voltage amplifier circuit; and
a minus output configured to provide the time-variant minus target voltage to the voltage amplifier circuit.

17. The ET amplifier apparatus of claim 16 wherein the target voltage processing circuit further comprises:
a plus bypass switch coupled between the plus voltage input and the plus input of the differential amplifier; and a minus bypass switch coupled between the minus voltage input and the minus input of the differential amplifier.

18. The ET amplifier apparatus of claim 17 wherein the controller is further configured to open the plus bypass switch and the minus bypass switch to cause the target voltage processing circuit to pre-process the time-variant target voltage based on the predefined high-order transfer function in response to the time-variant target voltage corresponding to the first modulation bandwidth.

19. The ET amplifier apparatus of claim 17 wherein the controller is further configured to close the plus bypass switch and the minus bypass switch to cause the target voltage processing circuit to pre-process the time-variant target voltage based on the predefined first-order real-pole/real-zero transfer function in response to the time-variant target voltage corresponding to the second modulation bandwidth.

20. The ET amplifier apparatus of claim 17 wherein the target voltage processing circuit further comprises:
a first plus resistor coupled between the plus voltage input and a first plus coupling node;
a second plus resistor coupled between the first plus coupling node and a second plus coupling node in series to the first plus resistor;
a first plus adjustable capacitor coupled between the second plus coupling node and the minus output in series to the second plus resistor;
a third plus resistor coupled between the minus output and the first plus coupling node in parallel to the first plus adjustable capacitor and the second plus resistor;
a second plus adjustable capacitor coupled between the plus voltage input and the first plus coupling node in parallel to the first plus resistor;
a first minus resistor coupled between the minus voltage input and a first minus coupling node;
a second minus resistor coupled between the first minus coupling node and a second minus coupling node in series to the first minus resistor;
a first minus adjustable capacitor coupled between the second minus coupling node and the plus output in series to the second minus resistor;
a third minus resistor coupled between the plus output and the first minus coupling node in parallel to the first minus adjustable capacitor and the second minus resistor;
a second minus adjustable capacitor coupled between the minus voltage input and the first minus coupling node in parallel to the first minus resistor; and
an adjustable capacitor coupled between the first plus coupling node and the first minus coupling node;
wherein the plus bypass switch is coupled between the first plus coupling node and the second plus coupling node in parallel to the second plus resistor; and
wherein the minus bypass switch is coupled between the first minus coupling node and the second minus coupling node in parallel to the second minus resistor.

21. The ET amplifier apparatus of claim 20 wherein the controller is further configured to:
store a first set parameter for causing the target voltage processing circuit to pre-process the time-variant target voltage based on the predefined high-order transfer function;
store a second set parameter for causing the target voltage processing circuit to pre-process the time-variant target voltage based on the predefined first-order real-pole/real-zero transfer function;
retrieve the first set parameter and configure the target voltage processing circuit based on the first set parameter in response to the time-variant target voltage corresponding to the first modulation bandwidth; and
retrieve the second set parameter and configure the target voltage processing circuit based on the second set parameter in response to the time-variant target voltage corresponding to the second modulation bandwidth.

22. The ET amplifier apparatus of claim 21 wherein:
the first set parameter comprises one or more first parameters related to the first plus adjustable capacitor, the first minus adjustable capacitor, and the adjustable capacitor; and
the second set parameter comprises one or more second parameters related to the first plus adjustable capacitor and the first minus adjustable capacitor.

* * * * *

UNITED STATES PATENT AND TRADEMARK OFFICE
CERTIFICATE OF CORRECTION

PATENT NO. : 10,868,499 B2  
APPLICATION NO. : 16/199532  
DATED : December 15, 2020  
INVENTOR(S) : Philippe Gorisse et al.

Page 1 of 1

It is certified that error appears in the above-identified patent and that said Letters Patent is hereby corrected as shown below:

In the Specification

At Column 7, Line 20, replace "80 MHz" with --$\leq$ 80 MHz--.

At Column 8, Line 59, replace "50 MHz" with --$\leq$ 50 MHz--.

At Column 11, Lines 56 and 57, replace "80 MHz" with --$\leq$ 80 MHz--.

At Column 13, Line 43, replace "80 MHz" with --$\leq$ 80 MHz--.

Signed and Sealed this  
Twenty-third Day of February, 2021

Drew Hirshfeld  
*Performing the Functions and Duties of the*  
*Under Secretary of Commerce for Intellectual Property and*  
*Director of the United States Patent and Trademark Office*